US008502290B2

United States Patent
Mao et al.

(10) Patent No.: US 8,502,290 B2
(45) Date of Patent: Aug. 6, 2013

(54) HIGH FULL-WELL CAPACITY PIXEL WITH GRADED PHOTODETECTOR IMPLANT

(75) Inventors: Duli Mao, Sunnyvale, CA (US); Hsin-Chih Tai, San Jose, CA (US); Vincent Venezia, Sunnyvale, CA (US); Yin Qian, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/615,196

(22) Filed: Sep. 13, 2012

(65) Prior Publication Data

US 2013/0001661 A1    Jan. 3, 2013

(51) Int. Cl.
*H01L 31/062* (2012.01)
*H01L 31/113* (2006.01)

(52) U.S. Cl.
USPC ............ 257/290; 257/292; 257/E31.073; 257/E21.53

(58) Field of Classification Search
USPC ....... 257/290, 292, E21.53, E31.073; 438/14, 438/199, 514, 519, 525, 527, 914
See application file for complete search history.

(56) References Cited

U.S. PATENT DOCUMENTS

| | | | |
|---|---|---|---|
| 6,900,484 | B2 | 5/2005 | Rhodes |
| 7,232,744 | B2 | 6/2007 | Ghneim et al. |
| 2009/0166696 | A1 | 7/2009 | Lee et al. |

*Primary Examiner* — Michelle Mandala
(74) *Attorney, Agent, or Firm* — Blakely Sokoloff Taylor & Zafman LLP

(57) ABSTRACT

Embodiments of a process for forming a photodetector region in a CMOS pixel by dopant implantation, the process comprising masking a photodetector area of a surface of a substrate for formation of the photodetector region, positioning the substrate at a plurality of twist angles, and at each of the plurality of twist angles, directing dopants at the photodetector area at a selected tilt angle. Embodiments of a CMOS pixel comprising a photodetector region formed in a substrate, the photodetector region comprising overlapping first and second dopant implants, wherein the overlap region has a different dopant concentration than the non-overlapping parts of the first and second implants, a floating diffusion formed in the substrate, and a transfer gate formed on the substrate between the photodetector and the transfer gate. Other embodiments are disclosed and claimed.

11 Claims, 10 Drawing Sheets

HIGH FULL-WELL CAPACITY PIXEL WITH GRADED PHOTODETECTOR IMPLANT

CROSS-REFERENCE TO RELATED APPLICATIONS

This application is a divisional of U.S. application Ser. No. 12/755,088, filed 6 Apr. 2010, and claims priority therefrom under 35 U.S.C. §120. U.S. application Ser. No. 12/755,088 is currently pending and is hereby incorporated by reference.

TECHNICAL FIELD

Embodiments of the present invention relate to semiconductor pixels and in particular, but not exclusively, to a pixel with a graded photodetector implant having a high full-well capacity.

BACKGROUND

As the pixel size of complementary metal oxide semiconductor (CMOS) image sensors becomes smaller for higher pixel density and lower cost, the active area of the photodetector also becomes smaller. For pinned photodetectors that are commonly used in CMOS image sensors, the smaller photodetector area leads to reduced full-well capacity, meaning that the maximum number of charges that can be held in the photodetector is reduced. The reduced full-well-capacity in turn results in a pixel with lower dynamic range and lower signal-to-noise ratio. Therefore, methods to increase the full-well-capacity of the pinned photodetector are highly desired.

In the p-n-p pinned photodetector most commonly used for CMOS image sensors, the most straightforward way to increase the pixel's full well capacity is to increase the doping level (i.e., the concentration of dopants) in the n-type layer, for example by increasing the implantation dosage. For small pixel sizes, however, the increased n-type doping can lead to significant increase in dark current and in defective pixels commonly referred to as white pixels. One reason for this is because of the increased electrical field along shallow trench isolation (STI) sidewalls due to the high n-type doping and the shrinking distance between n-type implant and STI edge.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. Figures are not to scale unless specifically designated as being to scale.

DETAILED DESCRIPTION OF THE ILLUSTRATED EMBODIMENTS

Embodiments of apparatus, system and method for a pixel with a graded implant having a high full-well capacity are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1A:
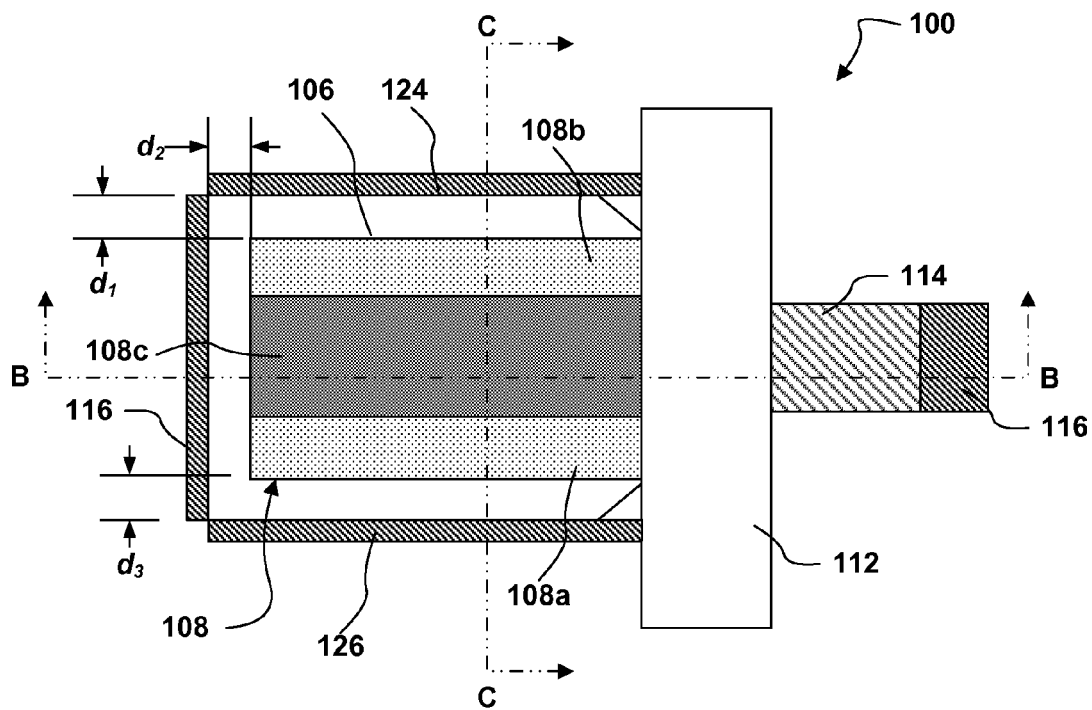
FIG. 1A is a plan view of an embodiment of a pixel.
Figure 1B:
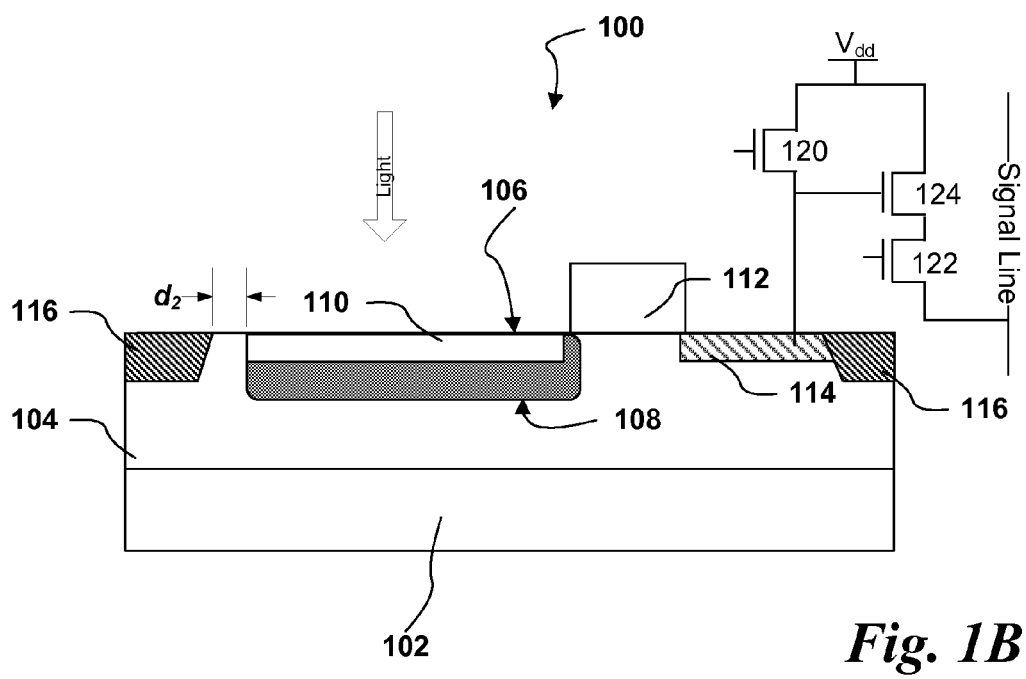
FIG. 1B is a combination schematic and cross-sectional view of the embodiment of a pixel shown in FIG. 1A, the cross-section being taken substantially along section line B-B in FIG. 1A.
Figure 1C:
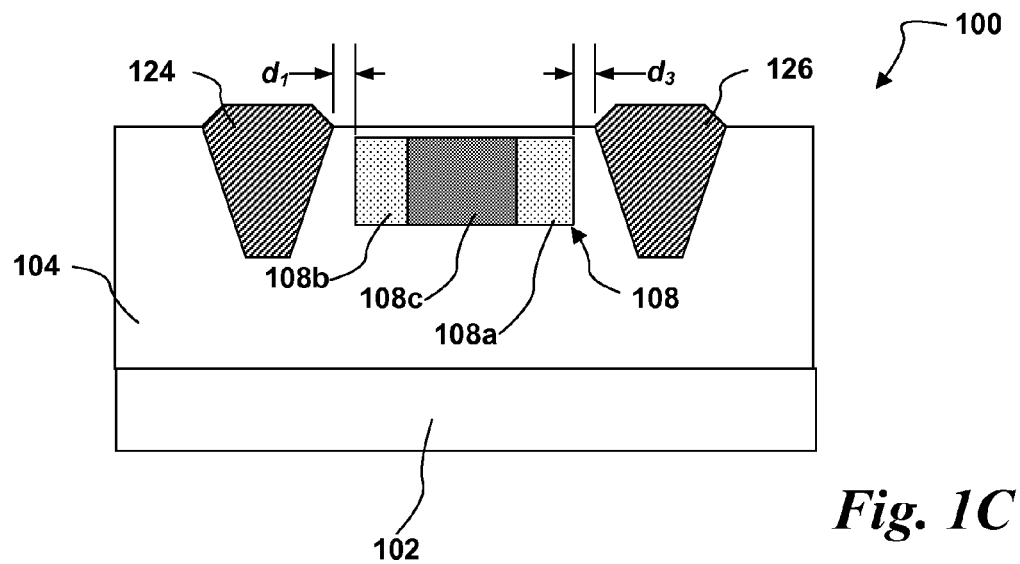
FIG. 1C is a cross-sectional view of the embodiment of the pixel shown in FIGS. 1A-1B, taken substantially along section line C-C in FIG. 1A.

FIGS. 1A-1C together illustrate an embodiment of a complementary metal oxide semiconductor (CMOS) pixel 100, such as those found in a pixel array within an image sensor. FIG. 1A illustrates a planar view of pixel 100. FIG. 1B illustrates a cross-sectional view of a portion of pixel 100, taken substantially along section line B-B in FIG. 1A. FIG. 1C illustrates a cross sectional view of a portion of pixel 100 taken substantially along section line C-C in FIG. 1A. Illustrated pixel 100 is an active four-transistor pixel, commonly known as a "4T active pixel," but in other embodiments pixel 100 could include more or less transistors. As shown in FIG. 1B pixel 100 is formed in an epitaxial (epi) layer 104 formed on substrate 102, and includes a photodetector 106, a floating node 114, and a transfer gate 112 that, when switched on, transfers charge accumulated in photodetector 106 to floating node 114. Shallow trench isolations (STIs) 116, 124 and 126 can be used to physically separate and electrically isolate pixel 100 from adjacent pixels in a pixel array. FIG. 1A shows a plan view of pixel 100 with STI regions shown as regions 116, 124 and 126, floating node 114 and transfer gate 112.

As shown in FIG. 1B, photodetector 106 is formed in epi layer 104 and includes a pinning region 110 and an implant 108 abutting and at least partially surrounding pinning region 110. In the illustrated embodiment, pinning region 110 is positioned at or near the surface of epi layer 104, but in other embodiments the pinning region can be positioned elsewhere or can be omitted entirely. In the illustrated embodiment pinning region 110 is a P-type region, implant 108 forms an N-type region and epi layer 104 is a P-type region, making photodetector 106 a p-n-p photodetector. In other embodiments of photodetector 106 the charge types (e.g, positive or negative charge carriers) of these elements can be reversed—that is, in other embodiments pinning region 110 can be N-type, implant region 108 can be P-type and epi layer 104 can be N-type, forming an n-p-n photodetector. In still other embodiments epi layer 104 can be undoped, whatever the charge types of the pinning region and the implant.

As shown in FIGS. 1A and 1C, in the illustrated embodiment of photodetector 106 implant region 108 includes three different component regions: an overlap region 108c and a pair of non-overlap regions 108a and 108b. Overlap region 108c, so called because it results from the overlap of two or more implanted regions, has a relatively higher dopant concentration than non-overlap regions 108a and 108b. As a result implant region 108 can have a larger lateral extent (i.e., it occupies more of the space between STIs 124 and 126 or, put differently, has a smaller distance $d_1$ and $d_3$) and is graded (i.e., it has a spatial dopant concentration gradient). Combining larger lateral extent with grading results in an implant with high full-well capacity but less of the problems associated with high electric fields at the lateral edges of the implant. As explained below, implant region 108 has three different component regions because it is made by overlapping two implant regions.

In a p-n-p embodiment of pixel 100, during an integration period (also referred to as an exposure period or accumulation period) photodetector 106 receives incident light, as shown by the arrow in FIG. 1B, and generates charge at the interface between pinning region 110 and implant region 108. After the charge is generated it is held as free electrons in implant region 108. At the end of the integration period, the electrons held in N-type implant region 108 (i.e., the signal) are transferred into floating node 114 by applying a voltage pulse to turn on transfer gate 112. When the signal has been transferred to floating node 114, transfer gate 112 is turned off again for the start of another integration period of photodetector 106. After the signal has been transferred from N-type implant region 108 to floating node 114, the signal held in floating node 114 is used to modulate amplification transistor 124, which is also known as a source-follower transistor. Finally, address transistor 122 is used to address the pixel and to selectively read out the signal onto the signal line. After readout through the signal line, a reset transistor 120 resets floating node 114 to a reference voltage, which in one embodiment is $V_{dd}$.

Figure 1D:
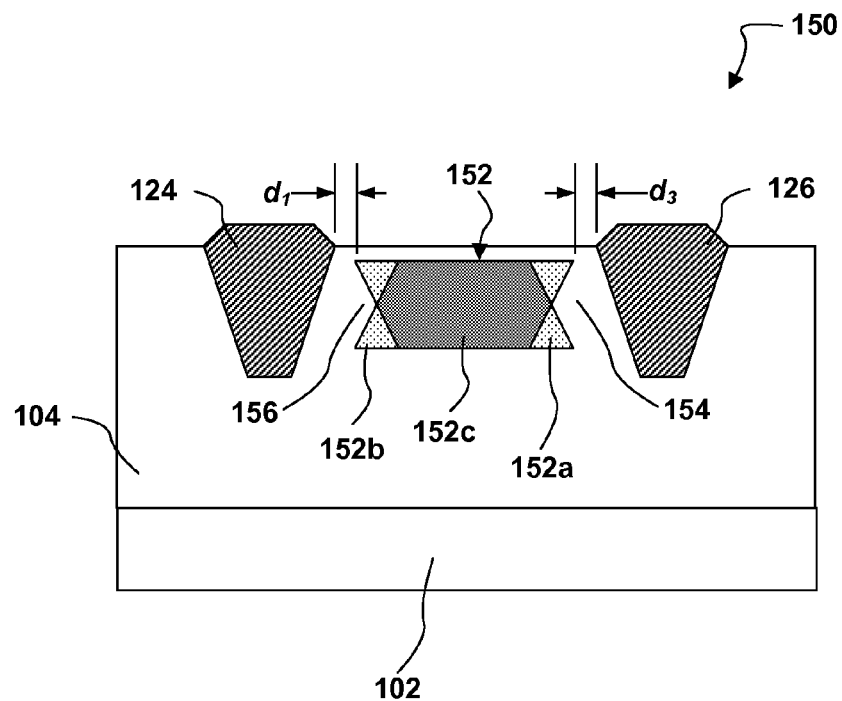
FIG. 1D is a cross-sectional elevation of an alternative embodiment of a pixel.

FIG. 1D illustrates a cross-section of an alternative embodiment of a pixel 150. Pixel 150 is in most respects similar to pixel 100, the primary difference being the structure of the implanted region. In pixel 150, the photodetector also includes a graded implant region 152 with three component regions: an overlap region 152c with a relatively higher dopant concentration and two non-overlap regions 152a and 152b with relatively lower dopant concentrations. Unlike implant region 108, in implant region 152 non-overlap regions 152a and 152b include notches 154 and 156 on the sides of the implanted region. Notches 154 and 156 can result from the tilt angle at which dopants are implanted into epi layer 104 on substrate 102.

Figure 2:
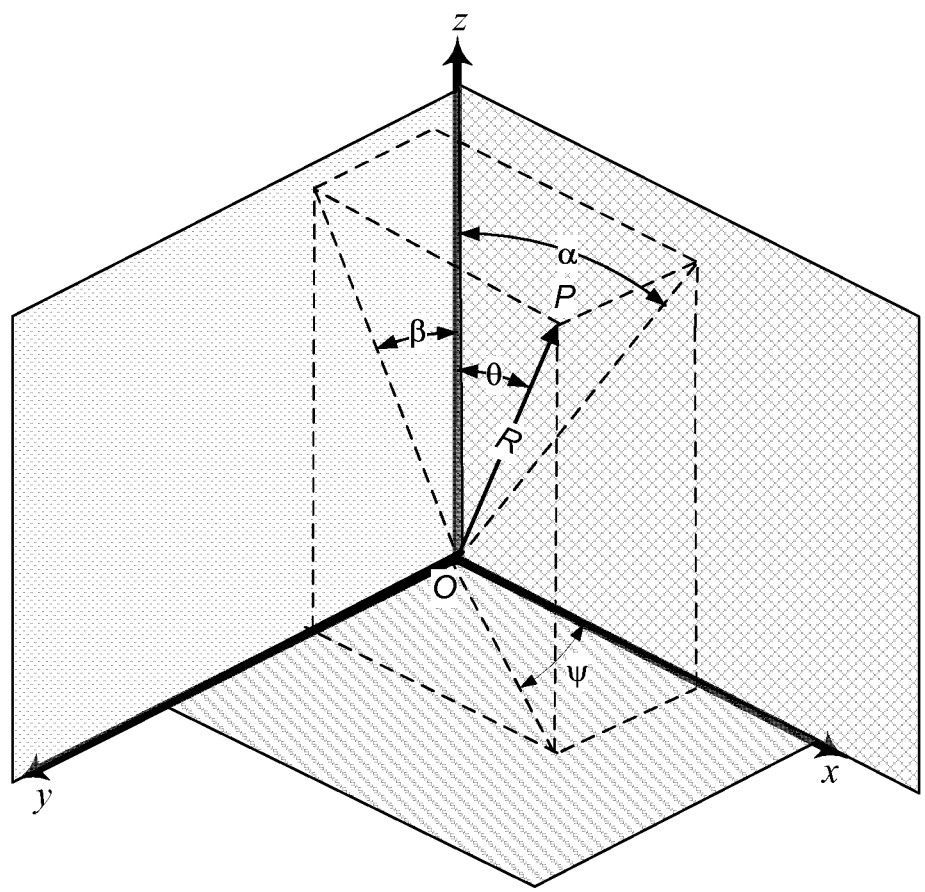
FIG. 2 is an isometric drawing of a spherical coordinate system superimposed on a Cartesian coordinate system.

FIG. 2 illustrates a spherical coordinate system and its superposition onto a Cartesian coordinate system. A spherical coordinate system is defined by (i) a reference plane containing an origin and an azimuth reference direction, and (ii) a zenith, which is a line that passes through the origin and is normal to the reference plane. In FIG. 2, the origin O is formed at the intersection of the x, y and z axes, Cartesian x-y plane forms the reference plane, the x axis forms the azimuth reference direction, and the z axis forms the zenith. The spherical coordinates of a point P are given by its radius R; its inclination angle θ, which is the angle between the zenith and the line segment OP; and its azimuth ψ, which is the angle measured from the azimuth reference direction to the orthogonal projection of the line segment OP on the reference plane (the x-y plane in this case). In FIG. 2, angle α is the angle relative to the zenith (the z axis in this case) of the orthogonal projection of OP onto the x-z plane, and angle β is the angle relative to the zenith (the z axis in this case) of the orthogonal projection of OP onto the y-z plane.

Figure 3A:
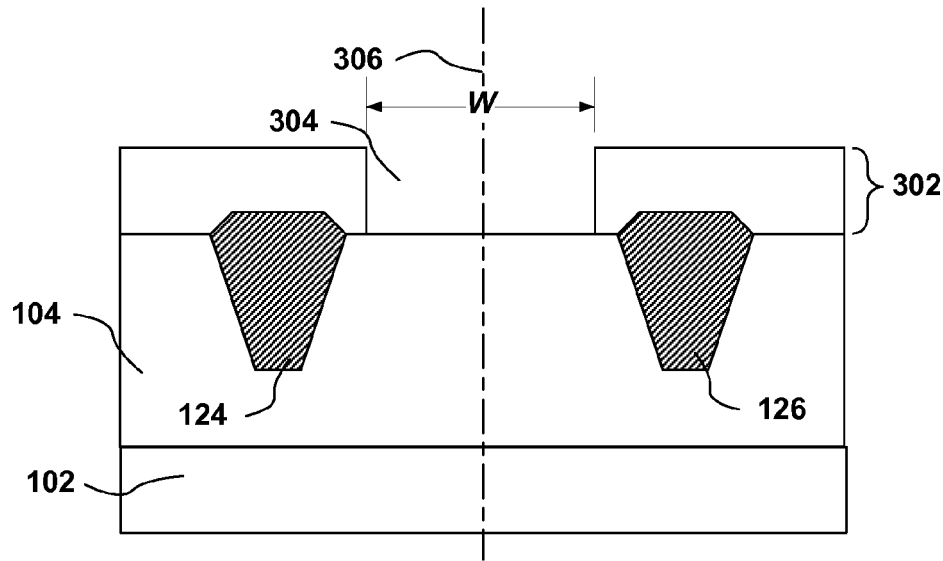
FIGS. 3A-3B are, respectively, a cross-sectional elevation and a plan view illustrating an embodiment of a process for manufacturing the embodiments of a pixel shown in FIGS. 1A-1D.
Figure 3B:
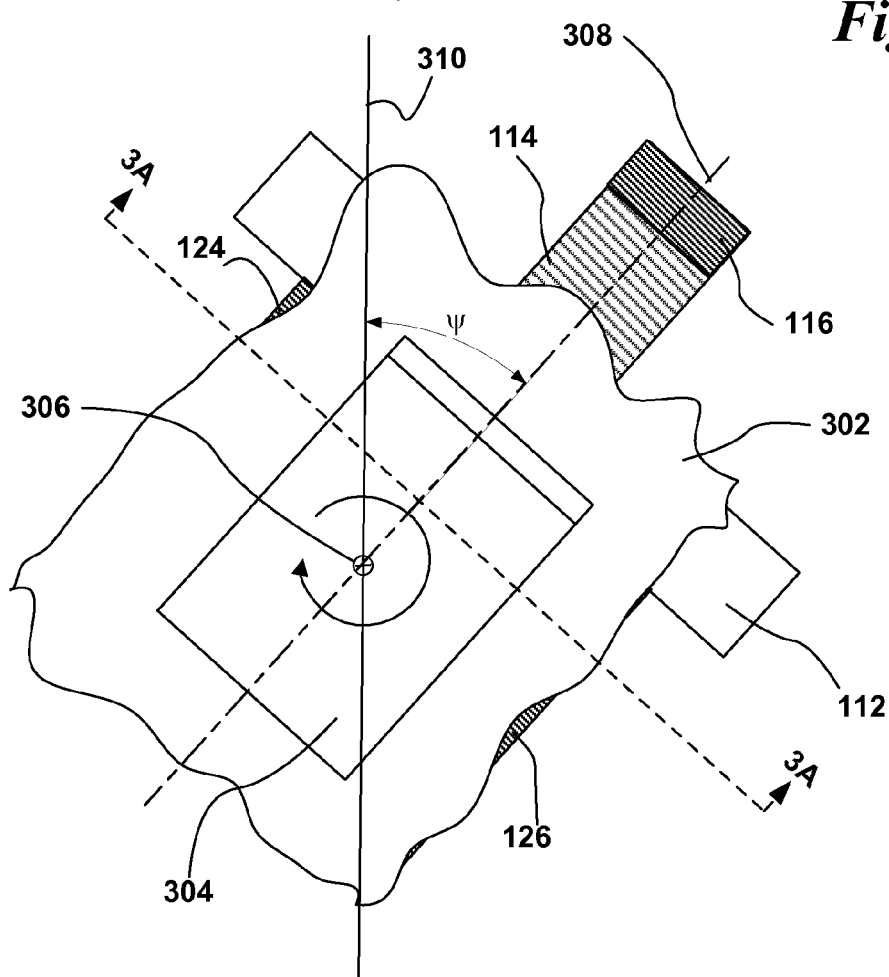

FIGS. 3A-3B together illustrate an initial part of an embodiment of a process for forming the pixel embodiments shown in FIGS. 1A-1D; FIG. 3B is a plan view, while FIG. 3A illustrates a cross-sectional view taken substantially along section line 3A-3A in FIG. 3B. In the illustrated embodiment, shown in FIG. 3A, elements of pixel 100 other than photodetector 106 (i.e., STIs 116, 124 and 126, floating diffusion 114, transfer gate 112, and so forth) are first formed in epi layer 104 on substrate 102, after which a mask layer 302 is applied to the front side of epi layer 104. Mask layer 302 is designed to prevent dopants from impinging on and penetrating epi layer 104 during dopant implantation. In one embodiment, mask layer 302 can be made of conventional photoresist, but in other embodiments it can be of a different substance. Mask layer 302 can be applied by various known methods.

After mask layer 302 is in place, it is patterned and etched by known methods (such as photolithography and wet or dry chemical etching) to create an opening 304 of width W in the mask layer, exposing the front side of a region of epi layer 104 in which photodetector 106 will be formed. With opening 304 in mask layer 302, dopants can be implanted in the desired region without also implanting them in other regions where other components are or will be formed. The illustrated embodiment only shows that part of mask layer 302 that surrounds opening 304 and shows other elements of pixel 100 exposed. While such an arrangement can be used in one embodiment, in other embodiments the mask layer can cover all or some of the other illustrated pixel elements, such as floating node 114, gate 112, etc., during dopant implantation.

Substrate 102 is positioned such that is can be twisted about an axis 306 that is substantially normal to the front side of substrate 102. In terms of the spherical coordinate system shown in FIG. 2, substrate 102 and the elements formed on it are positioned substantially in the reference plane (the x-y plane in FIG. 2), and axis 306 corresponds to the zenith (the z axis in FIG. 2). In the illustrated embodiment, axis 306 coincides approximately with the center of opening 304, but in other embodiments axis 306 can be offset from opening 304. For example, in a production environment there are usually many image sensors, each with a pixel array having a large number of pixels, formed on a semiconductor wafer. In such a production environment, axis 306 can coincide with the center of the semiconductor wafer, which may or may not coincide with the center of any pixel or pixel array on the wafer.

As shown in FIG. 3B, substrate 102 can be twisted about axis 306 to any arbitrary twist angle ψ relative to a reference direction. In the illustrated embodiment, twist angle ψ is defined as the angle between a fixed reference line 310 and a line 308 that rotates with the substrate and substantially bisects opening 304 and floating diffusion 114. With reference again to FIG. 2, reference line 310 is analogous to the azimuth reference (the x axis in FIG. 2), and twist angle ψ is analogous to the azimuth angle. In other embodiments twist angle ψ can be defined differently, so long as it can be used to characterize a rotation of substrate 102 about an axis such as axis 306.

Figure 4A:
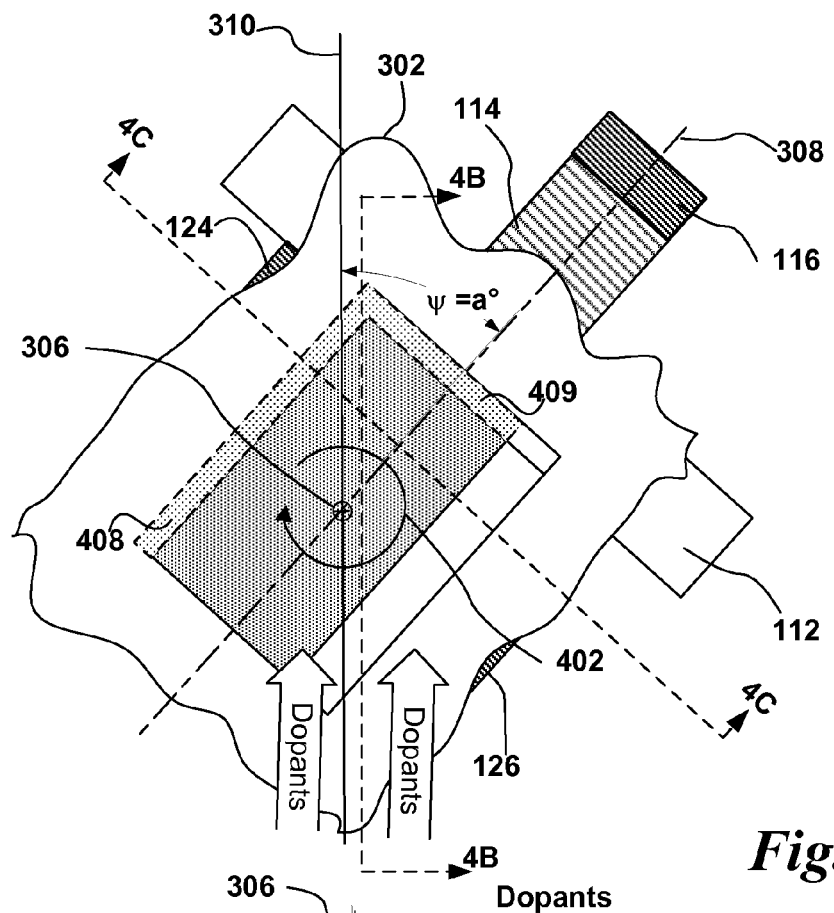
FIGS. 4A-4C are, respectively, a plan view, a cross-sectional view substantially along section line 4B-4B of FIG. 4A, and a cross-sectional view substantially along section line 4C-4C of FIG. 4A further illustrating an embodiment of a process for manufacturing the embodiments of a pixel shown in FIGS. 1A-1D.
Figure 4B:
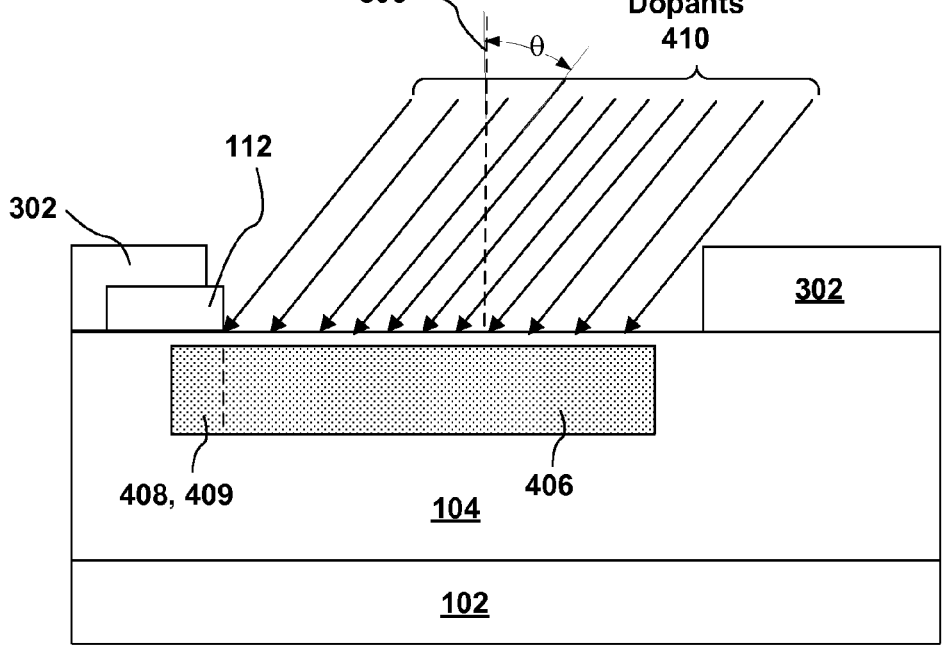
Figure 4C:
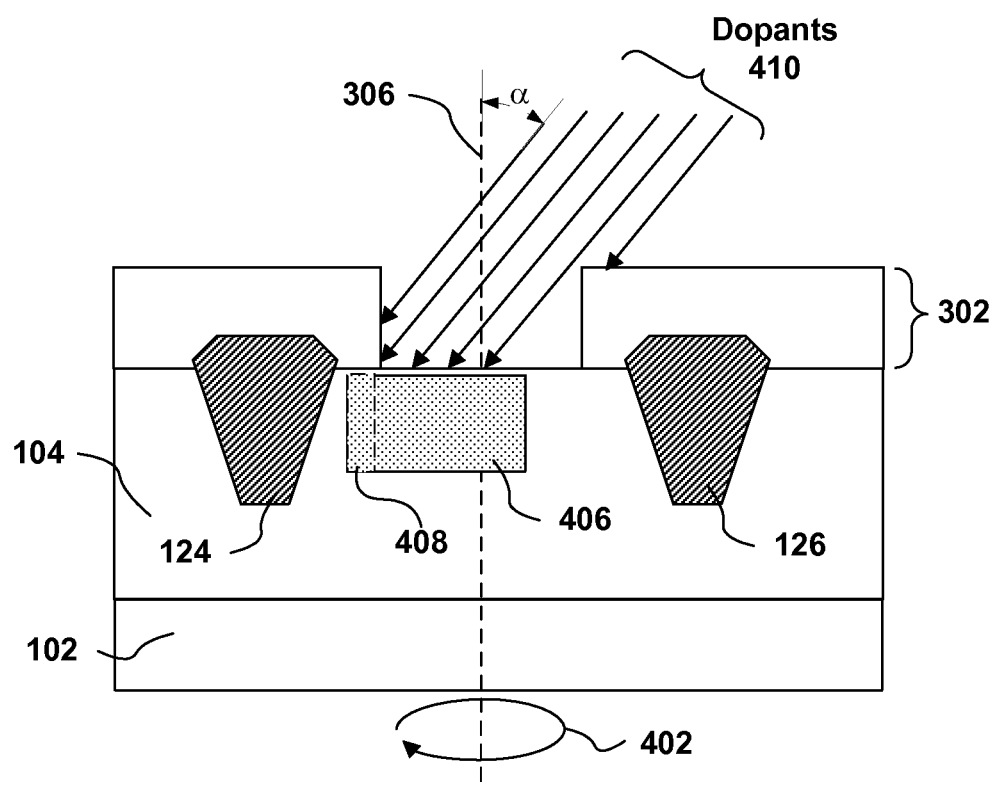

FIGS. 4A-4C illustrate another part of an embodiment of a process for forming the photodetector implant region in the pixel embodiments shown in FIGS. 1A-1D. FIG. 4A is a plan view, while FIGS. 4B and 4C illustrate cross-sectional views taken substantially along section lines 4B-4B and 4C-4C in FIG. 4A. With ψ as shown in FIG. 3B, the initial twist position corresponds to ψ=a°.

As shown in FIG. 4B, after positioning the substrate at the initial twist position, dopants 410 are directed at the exposed surface of epi layer 104. In addition to being directed at the substrate at a selected dosage and energy, dopants 410 are directed at the substrate at a non-zero tilt angle θ relative to a line substantially normal to the front side of epi layer 104, in this case axis 306. Again referring to FIG. 2, with substrate 102 and the elements formed on it positioned substantially in the reference plane (the x-y plane in FIG. 2), tilt angle θ corresponds to inclination angle θ shown in FIG. 2. Because of the presence of mask layer 302, dopants 410 are only able to reach the exposed front side of epi layer 104 in opening 304. As further discussed below, tilt angle θ is selected based on various factors including the lateral extent desired for implant region 406 under mask 302.

As dopants 410 bombard the exposed part of the front side of epi layer 104, they penetrate into the interior of epi layer 104 and form a first implant region 406 within epi layer 104. As a result of the non-zero tilt angle θ, a portion 408 of first implant 406 ends up being formed in the part of epi layer 104 that is underneath mask layer 302 (see also FIG. 4C). Another portion 409 of first implant region 406 is formed due to twist angle ψ=a° in the part of epi layer 104 that is underneath transfer gate 112. Use of tilt angle θ thus increases the lateral extent of the implant and reduces the distance between implant region 406 and STI 124 (i.e., distance $d_1$ in FIG. 1C). Generally, the larger the tilt angle θ, the more first implant region 406 will extend laterally, making portion 409 larger and also making region 408 under mask layer 302 larger and distance $d_1$ between the edge of implant region 406 and STI 124 smaller.

FIG. 4C illustrates how portion 408 of implant 406 extends under mask layer 302. Since the plane along which section 4C-4C is at an angle relative to the plane along which section 4B-4B is taken, the angle α shown in FIG. 4C is not tilt angle θ, but instead is the orthogonal projection of tilt angle θ onto the plane of section 4C-4C.

Figures 5A, 5B:
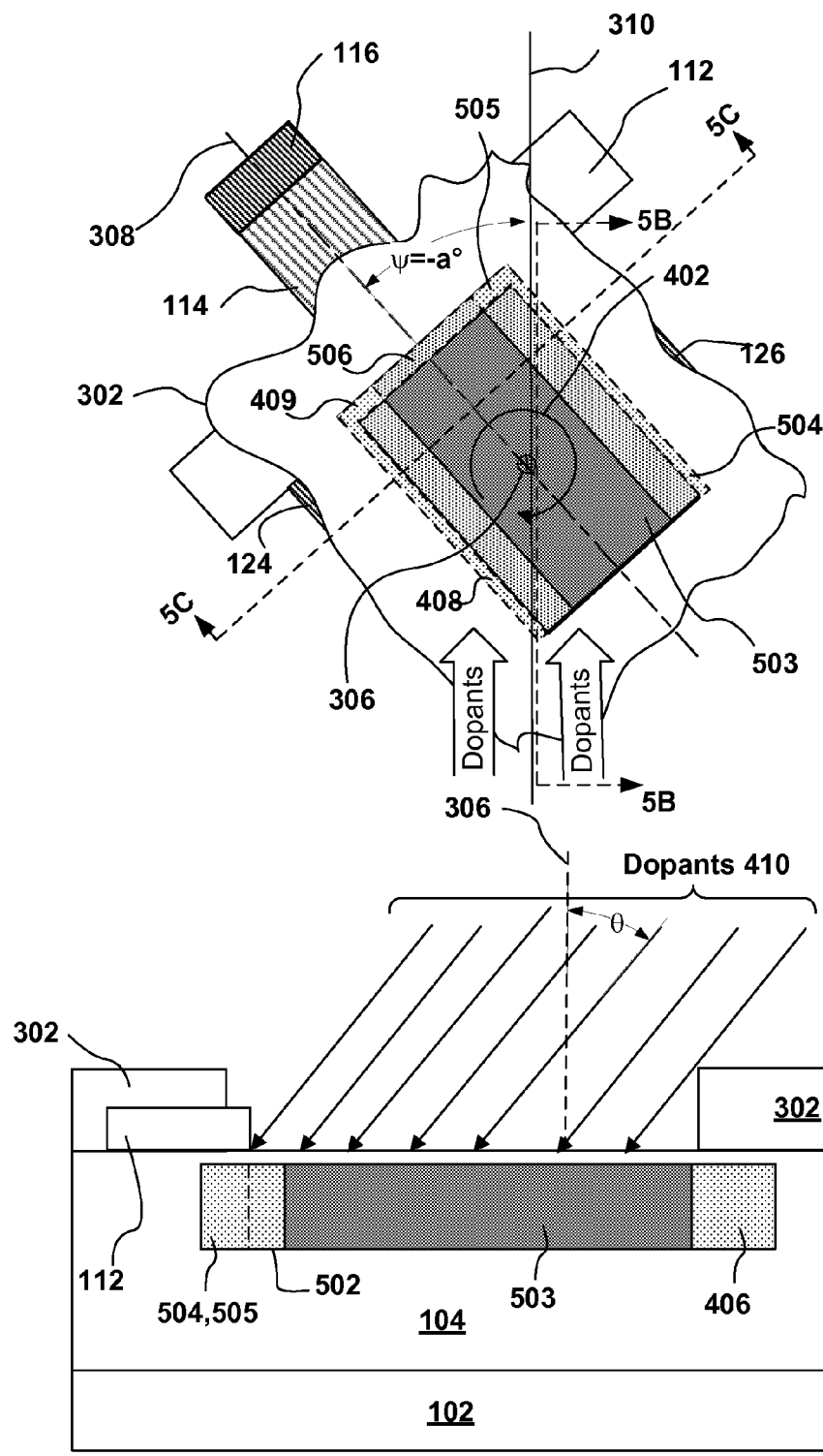
FIGS. 5A-5C are, respectively, a plan view, a cross-sectional view substantially along section line 5B-5B of FIG. 5A, and a cross-sectional view substantially along section line 5C-5C of FIG. 5A further illustrating an embodiment of a process for manufacturing the embodiments of a pixel shown in FIGS. 1A-1D.
Figure 5C:
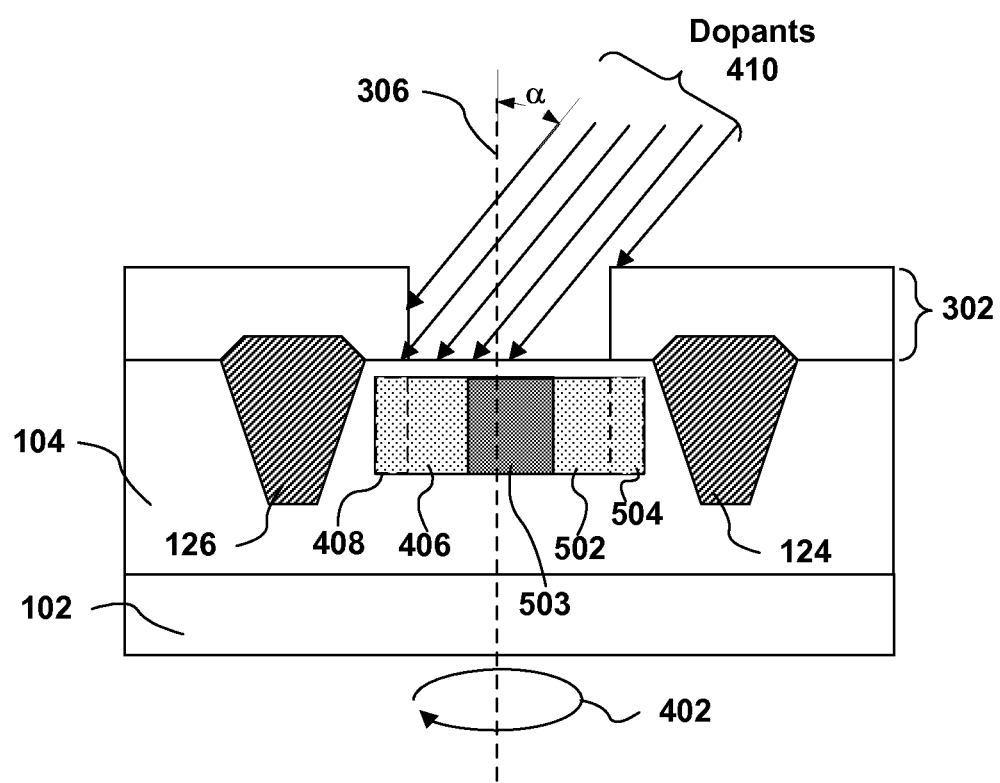

FIGS. 5A-5C together illustrate another part of an embodiment of a process for forming the photodetector implant region in the pixel embodiments shown in FIGS. 1A-1D. FIG. 5A is a plan view, while FIGS. 5B and 5C illustrate cross-sectional views taken substantially along section line 5B-5B and 5C-5C in FIG. 5B. Starting with the state shown in FIGS. 4A-4B, substrate 102 is rotated about axis 306, as illustrated by arrow 402, to an additional twist position different than the initial twist position. With ψ defined as shown in FIG. 3B, the additional twist position illustrated in FIG. 5B corresponds to ψ=−a°, which could be interpreted as a reflection of line 308 about fixed line 310. Although only one additional twist position is illustrated, in other embodiments there can be more than one additional twist position after the initial twist position, depending on the desired final structure of photodetector implant region 108.

After positioning substrate 102 at the additional twist position, dopants 410 are again directed at the front surface of epi layer 104. In addition to being directed at the substrate with a selected dosage and energy, dopants 410 are again directed at the substrate at a non-zero tilt angle θ relative to a line substantially normal to the front side of epi layer 104, in this case axis 306. As before, tilt angle θ is selected based on various factors including the desired lateral extent of the implant region. In one embodiment, the tilt angle θ used at the additional twist position can be the same as the tilt angle used at the initial twist position, but in other embodiments the tilt angle used at an additional twist position need not be the same as the tilt angle used at the initial twist position or the tilt angle used at any other additional twist position.

Because of the presence of mask layer 302, dopants 410 are only able to reach the exposed front side of epi layer 104 in opening 304. As dopants 410 bombard the exposed part of the front side of epi layer 104, they penetrate the surface and form a second implant 502 within the epi layer. Second implant region 502 overlaps in part with first implant region 406 to form an overlap region 503 with relatively higher dopant concentration. The combination of first implant region 406 with second implant region 502 thus creates photodetector implant region 108 of FIGS. 1A to 1D, in which overlap region 108c corresponds to overlap region 503, non-overlapping region 108b corresponds to the region of first implant 406 that does not overlap with second implant region 502, and non-overlapping region 108a of FIGS. 1A and 1C corresponds to the region of second implant 502 that does not overlap with first implant region 406. As a result of the overlap of first implant region 406 and second implant region 502, overlap region 108c has a relatively higher dopant concentration than non-overlapping regions 108a and 108b, making implant 108 a graded implant.

As with first implant region 406, the non-zero tilt angle θ at which dopants are implanted results in a portion 504 of second implant region 502 being formed in the part of epi layer 104 that is underneath mask layer 302. Another portion 505 of second implant region 502 is formed due to twist angle ψ=−a°, in the part of epi layer 104 that is underneath transfer gate 112. Use of tilt angle θ thus increases the lateral extent of second implant region 502 and reduces the distance between implant region 502 and STI 126 (i.e., distance $d_3$ in FIG. 1C). Generally, the larger the tilt angle θ, the more second implant region 502 will extend laterally, making region 504 under mask layer 302 larger and the distance $d_3$ between the edge of implant region 502 and STI 126 smaller. As seen in FIG. 5A, the overlap of portion 409 of first implant region 406 and portion 505 of second implant region 502 forms overlap portion 506 under transfer gate 112.

FIG. 5C illustrates a cross-section of implant 406 taken along line 5C-5C in FIG. 5A, and shows how portions 408 and 504 extend under mask layer 302. Since the plane along which section 5C-5C is at an angle relative to the plane along which section 5B-5B is taken, the angle α shown in FIG. 5C is not tilt angle θ, but instead is the orthogonal projection of tilt angle θ onto the plane of section 5C-5C.

Figure 6A:
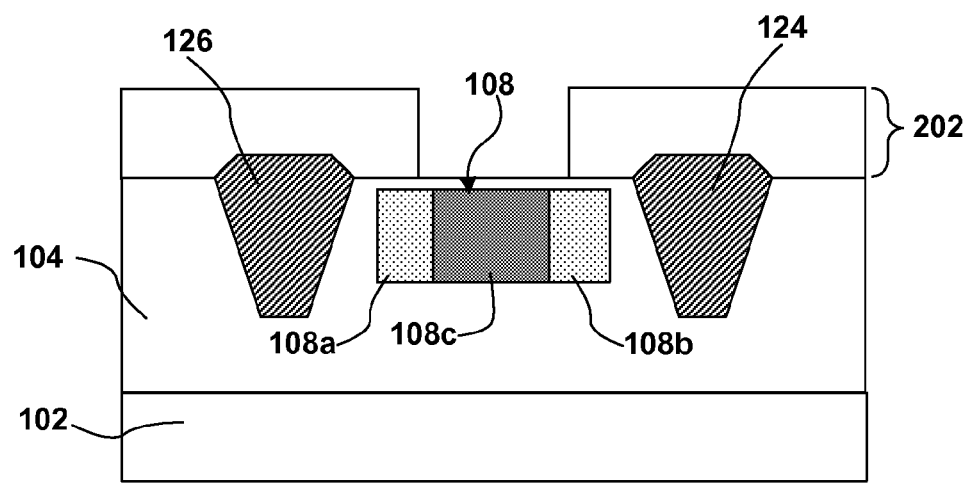
FIGS. 6A-6B are cross-sectional views further illustrating an embodiment of a process for manufacturing the embodiments of a pixel shown in FIGS. 1A-1D.
Figure 6B:
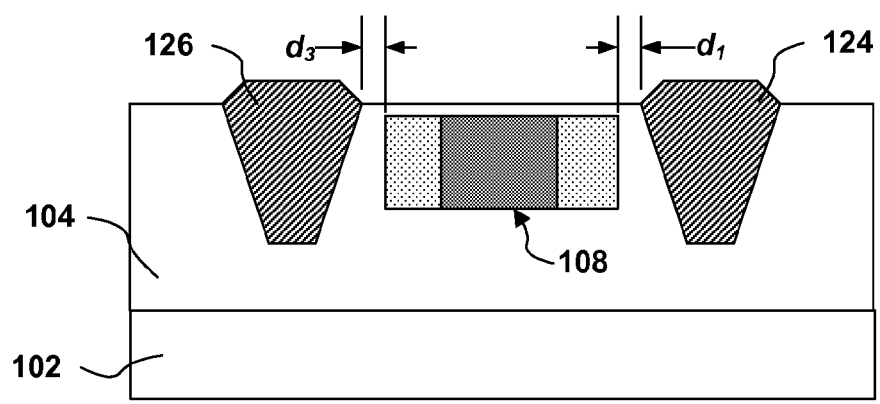

FIGS. 6A-6B together illustrate another part of an embodiment of a process for forming the photodetector implant region in the pixel embodiments shown in FIGS. 1A-1D. In FIG. 6A, photodetector implant region 108 has been formed in epi layer 104 and mask layer 302 remains in place on the front side of epi layer 104. In FIG. 6B, mask layer 302 is removed from the front side of substrate 102, leaving graded implant region 108 with one lateral side at a distance $d_1$ from STI 124 and the opposite lateral side at a distance $d_3$ from STI 126. Because implant region 108 is graded, distances $d_1$ and $d_3$ can be smaller than they would otherwise need to be to avoid creating problems associated with high electric fields at the edges of the implant, such as dark current and white pixels.

In other embodiments, mask layer 302 can be left in place while other elements of pixel 100, such as pinning layer 110, are formed; mask layer 302 can then be removed later to leave the final pixel 100. Alternatively, if any more pixel elements remain to be formed, mask layer 302 can be removed and additional elements added to pixel 100 with or without the use of additional mask layers.

Figure 7:
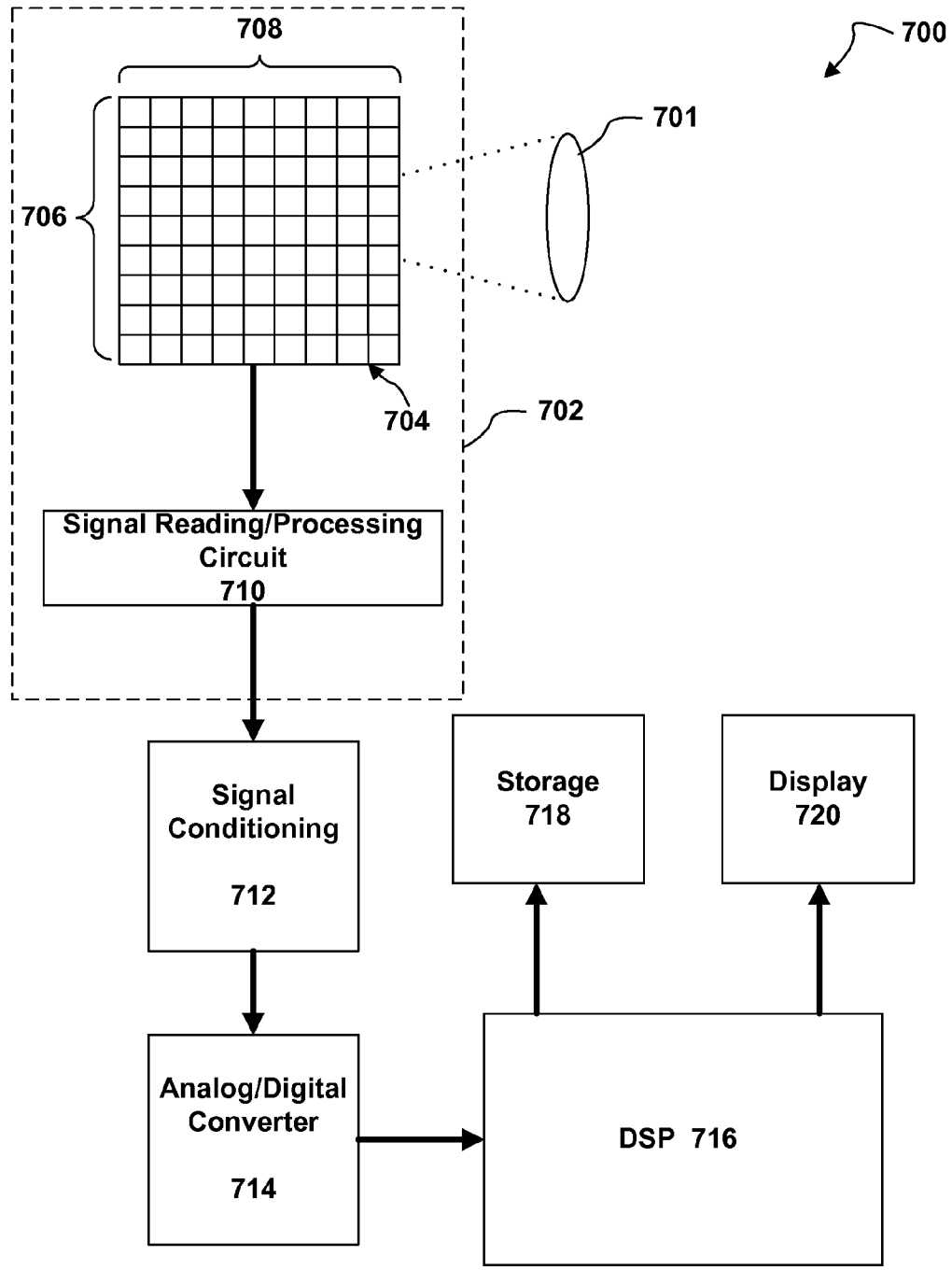
FIG. 7 is a block diagram of an embodiment of an imaging system that can employ an embodiment of an image sensor using the pixel embodiments shown in FIG. 1A-1D.

FIG. 7 illustrates an embodiment of an imaging system 700. Optics 701, which can include refractive, diffractive or reflective optics or combinations of these, are coupled to image sensor 702 to focus an image onto the pixels in pixel array 704 of the image sensor. Pixel array 704 captures the image and the remainder of imaging system 700 processes the pixel data from the image.

Image sensor 702 comprises a pixel array 704 and a signal reading and processing circuit 710. In one embodiment, image sensor 702 is a backside-illuminated image sensor including a pixel array 704 that is two-dimensional and includes a plurality of pixels arranged in rows 706 and columns 708. One or more of the pixels in pixel array 704 can be one of the pixel embodiments shown in FIGS. 1A-1D. During operation of pixel array 704 to capture an image, each pixel in pixel array 704 captures incident light (i.e., photons) during a certain exposure period and converts the collected photons into an electrical charge. The electrical charge generated by each pixel can be read out as an analog signal, and a characteristic of the analog signal such as its charge, voltage or current will be representative of the intensity of light that was incident on the pixel during the exposure period.

Illustrated pixel array 704 is regularly shaped, but in other embodiments the array can have a regular or irregular arrangement different than shown and can include more or less pixels, rows, and columns than shown. Moreover, in different embodiments pixel array 704 can be a color image sensor including red, green, and blue pixels designed to capture images in the visible portion of the spectrum, or can be a black-and-white image sensor and/or an image sensor designed to capture images in the invisible portion of the spectrum, such as infra-red or ultraviolet.

Image sensor 702 includes signal reading and processing circuit 710. Among other things, circuit 710 can include circuitry and logic that methodically reads analog signals from each pixel, filters these signals, corrects for defective pixels, and so forth. In an embodiment where circuit 710 performs only some reading and processing functions, the remainder of the functions can be performed by one or more other components such as signal conditioner 712 or DSP 716. Although shown in the drawing as an element separate from pixel array 704, in some embodiments reading and processing circuit 710 can be integrated with pixel array 704 on the same substrate or can comprise circuitry and logic embedded within the pixel array. In other embodiments, however, reading and processing circuit 710 can be an element external to pixel array 704 as shown in the drawing. In still other embodiments, reading and processing circuit 710 can be an element not only external to pixel array 704, but also external to image sensor 702.

Signal conditioner 712 is coupled to image sensor 702 to receive and condition analog signals from pixel array 704 and reading and processing circuit 710. In different embodiments, signal conditioner 712 can include various components for conditioning analog signals. Examples of components that can be found in the signal conditioner include filters, amplifiers, offset circuits, automatic gain control, etc. In an embodiment where signal conditioner 712 includes only some of these elements and performs only some conditioning functions, the remaining functions can be performed by one or more other components such as circuit 710 or DSP 716. Analog-to-digital converter (ADC) 714 is coupled to signal conditioner 712 to receive conditioned analog signals corresponding to each pixel in pixel array 704 from signal conditioner 712 and convert these analog signals into digital values.

Digital signal processor (DSP) 716 is coupled to analog-to-digital converter 714 to receive digitized pixel data from ADC 714 and process the digital data to produce a final digital image. DSP 716 can include a processor and an internal memory in which it can store and retrieve data. After the image is processed by DSP 716, it can be output to one or both of a storage unit 718 such as a flash memory or an optical or magnetic storage unit and a display unit 720 such as an LCD screen.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A CMOS pixel comprising:
a photodetector region formed in a substrate by dopant implantation, the photodetector region comprising overlapping first and second dopant implants, wherein the overlap region has a different dopant concentration than the non-overlapping parts of the first and second dopant implants, wherein the first dopant implant is formed by directing dopants at the substrate at a selected tilt angle and at an initial twist position and the second dopant implant is formed by directing dopants at the substrate at the selected tilt angle and at an additional twist position different than the initial twist position, and wherein the twist position is an angle of rotation about an axis normal to the surface of the substrate;
a floating diffusion formed in the substrate; and
a transfer gate formed on the substrate between the photodetector and the transfer gate.

2. The CMOS pixel of claim 1 wherein the photodetector region includes a notch in each of two opposing lateral sides thereof.

3. The CMOS pixel of claim 1 wherein the tilt angle is measured relative to a line substantially normal to the surface of the substrate.

4. The CMOS pixel of claim 1, further comprising a pinning layer with a charge type opposite the charge type of the photodetector region, wherein the pinning layer is formed over the photodetector region and at or near the surface of the substrate.

5. The CMOS pixel of claim 1 wherein the non-overlapping part of the first dopant implant has a different dopant concentration than the non-overlapping part of the second dopant implant.

6. A system comprising:
a CMOS image sensor formed in a substrate, wherein the CMOS image sensor has a pixel array including a CMOS pixel comprising:
- a photodetector region formed in a substrate by dopant implantation, the photodetector region comprising overlapping first and second dopant implants, wherein the overlap region has a different dopant concentration than the non-overlapping parts of the first and second dopant implants, wherein the first dopant implant is formed by directing dopants at the substrate at a selected tilt angle and at an initial twist position and the second dopant implant is formed by directing dopants at the substrate at the selected tilt angle and at an additional twist position different than the initial twist position, and wherein the twist position is an angle of rotation about an axis normal to the surface of the substrate,
- a floating diffusion formed in the substrate, and
- a transfer gate formed on the substrate between the photodetector and the transfer gate; and processing circuitry coupled to the pixel array to process a signal received from the pixel array.

7. The system of claim 6 wherein the photodetector region includes a notch in each of two opposing lateral sides thereof.

8. The system of claim 6 wherein the tilt angle is measured relative to a line substantially normal to the surface of the substrate.

9. The system of claim 6 wherein the CMOS pixel further comprises a pinning layer with a charge type opposite the charge type of the photodetector region, wherein the pinning layer is formed over the photodetector region and at or near the surface of the substrate.

10. The system of claim 6 wherein the non-overlapping part of the first dopant implant has a different dopant concentration than the non-overlapping part of the second dopant implant.

11. The system of claim 6 wherein the processing circuitry includes a digital signal processor coupled to the image sensor to process the signals received from the image sensor.

* * * * *